United States Patent [19]

Kuneman et al.

[11] Patent Number: 4,563,383
[45] Date of Patent: Jan. 7, 1986

[54] DIRECT BOND COPPER CERAMIC SUBSTRATE FOR ELECTRONIC APPLICATIONS

[75] Inventors: James E. Kuneman, Liverpool; Joseph F. Dickson, Camden, both of N.Y.

[73] Assignee: General Electric Company, Syracuse, N.Y.

[21] Appl. No.: 595,557

[22] Filed: Mar. 30, 1984

[51] Int. Cl.$^4$ ............................................. B32B 15/04
[52] U.S. Cl. .................................. 428/216; 428/901; 428/701; 428/699; 428/469
[58] Field of Search ............... 428/469, 901, 216, 701, 428/699

[56] References Cited

U.S. PATENT DOCUMENTS

| | | | |
|---|---|---|---|
| 2,570,248 | 10/1951 | Kelley | 29/179.5 |
| 2,857,663 | 10/1958 | Beggs | 29/473.1 |
| 3,744,120 | 7/1973 | Burgess | 29/494 |
| 3,766,634 | 10/1973 | Babcock et al. | 29/471.9 |
| 3,854,892 | 12/1974 | Burgess et al. | 29/196.1 |
| 3,911,553 | 10/1975 | Burgess et al. | 228/173 |
| 3,993,411 | 11/1976 | Babcock et al. | 403/271 |
| 3,994,430 | 11/1976 | Cusano et al. | 228/122 |
| 4,189,331 | 2/1980 | Roy | 428/469 X |
| 4,387,137 | 6/1983 | Rice | 428/469 X |

OTHER PUBLICATIONS

M. Wittmer, C. R. Boer, and P. Gudmundson, "Mechanical Properties of Liquid-Phase-Bonded Copper-Ceramic Substrates", Journal of American Ceramic Society, Mar. 1982, pp. 149-153.
J. F. Burgess, C. A. Neugebauer, G. Flanagan, R. E. Moore, "Hybrid Packages by the Direct Bonded Copper Process", May 1975, Solid State Technology, pp. 42-44.
H. Keser, C. Schuler and M. Wittmer, Baden-Dattwil, "Some Properties of Liquid-Phase Bonding Between Copper and Ceramics", Oct. 1980, Proceedings of the Joint Conference of the German Welding Society and German Ceramics Society, *Joining of Ceramics, Glass and Metal.*
Gioia, J. Charles, General Electric Company, "MIC Package Using Thick Film and Direct Bond Copper* for 100-W L-Band Power Amplifier", International Society for Hybrid Microelectronics (ISHM), Nov. 1979, pp. 214-218.
Dickson, J. F., General Electric Company, "Direct Bond Copper Technology: Materials, Methods, Applications", *The International Journal for Hybrid Microelectronics,* vol. 5, No. 2, Nov. 1982, pp. 103-109.

Primary Examiner—George F. Lesmes
Assistant Examiner—Nancy A. B. Swisher
Attorney, Agent, or Firm—Richard V. Lang; Carl W. Baker

[57] ABSTRACT

A thin, direct bond copper ceramic substrate of high strength and good thermal conductivity and suitable for high temperature thick film processing is described. It comprises two outer layers of alumina of equal thickness and matching dimensions for bending stress equalization, and an inner copper core, itself formed of three component layers, bonded by a copper oxygen eutectic between the layers of alumina. The thickness of the copper core is held between one-tenth and one-third the thickness of the substrate. The laminated structure, which permits recycling for high temperature thick film processing, sustains stresses at working temperatures, strengthening the substrate, and provides high thermal conductivity for heat management in a high density environment.

10 Claims, 5 Drawing Figures

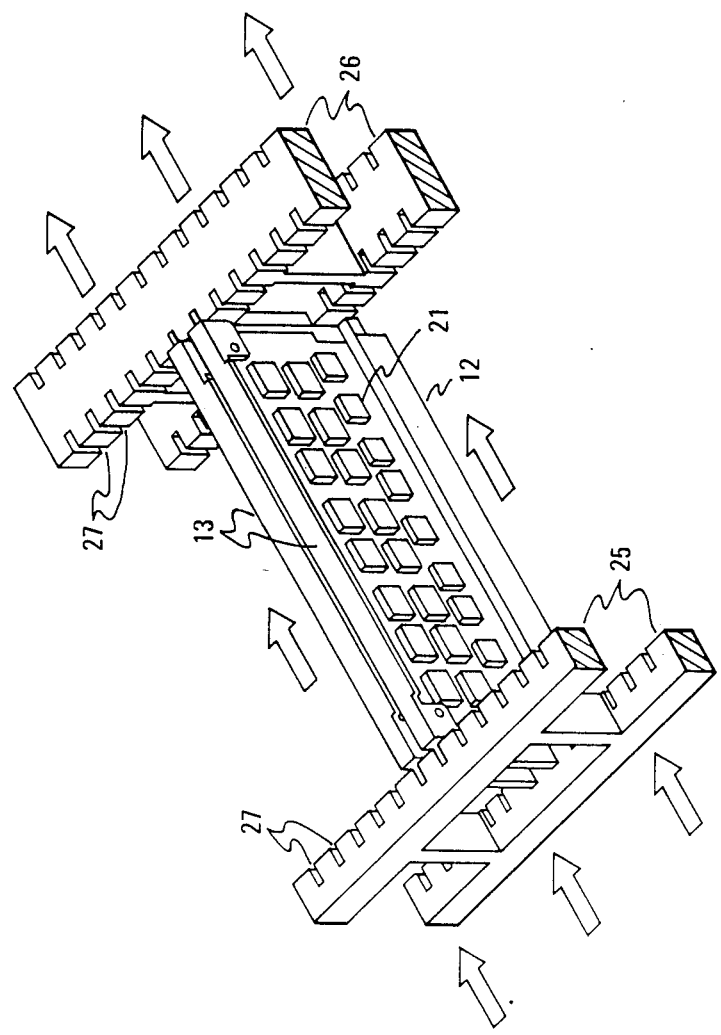
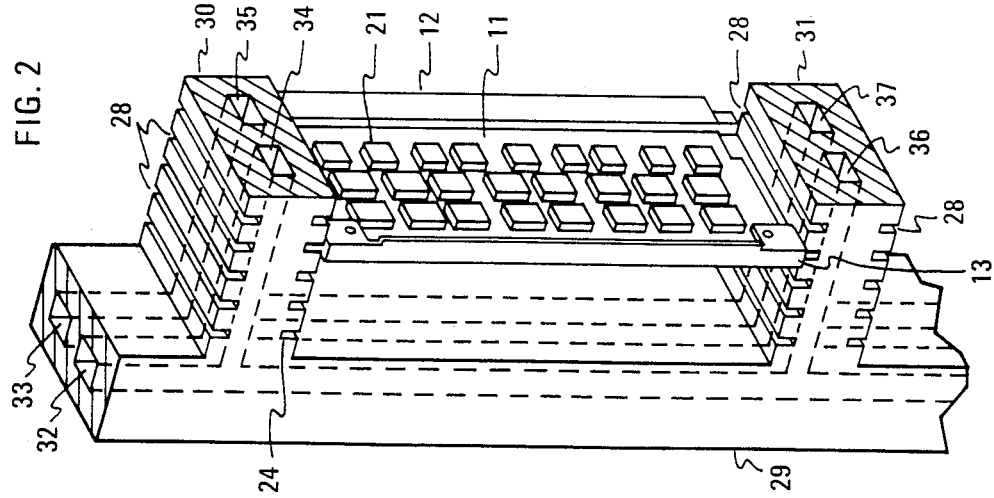

DIRECT BOND COPPER CERAMIC SUBSTRATE FOR ELECTRONIC APPLICATIONS

BACKGROUND OF THE INVENTION

1. Field of the Invention

The invention relates to an improved substrate for supporting electronic circuitry such as pluralities of integrated circuit chips, ceramic chip packages, discrete components etc., and requiring high temperature "thick film" interconnections. More particularly, the invention relates to an improved copper ceramic substrate of a thin, structurally strong design having a thermal design optimized for high density applications.

2. Description of the Prior Art

High temperature eutectic bonds for ceramic to metal seals have been made in power tubes and power semiconductors for some time. Such seals have been described in U.S. Pat. Nos. 3,744,120 (Burgess et al) and 3,766,634 (Babcock et al). In the Babcock et al patent entitled "Method of Direct Bonding of Metals to Non-Metallic Substrates", the formation of single bonds between a metal and a ceramic using a copper oxygen eutectic are shown. In addition, two three layer bonds are shown. In one case, two metallic layers are formed over a metallic core. The latter arrangement is used in the cylindrical seals used in fabricating high frequency vacuum tubes. A third U.S. Pat. No. 3,944,430 to Cusano et al deals with a cylindrical housing for a semiconductor device in one embodiment in which a cylindrical ceramic is bonded between two metallic members. In a further embodiment, an electrical circuit board assembly is suggested for application as the substrate for an SCR pellet. In this substrate, the core of the substrate is a ceramic, the upper surface is largely covered with a patterned copper conductor and the lower surface is covered with an unpatterned copper layer, the latter layer being used for soft soldering the entire assembly to a heat sink.

The applicability of such teaching to larger substrates has been suggested in an article in the IEEE March 1982, pages 149–153 by Wittmer entitled "Mechanical Properties of Liquid Phase Bonded Ceramic Substrates". The IEEE article considers both symmetric and nonsymmetric arrangements of an experimental nature in which a central ceramic core is provided with a copper layer on the top and bottom to form a laminate structure. The practical substrates described are used for power electronics devices and for monolithic rotors for disk motors. In these practical constructions, the copper on at least one surface of the ceramic is segmented, precluding the mechanical design from achieving true symmetry.

Substrates designed for mounting plural chip carriers, discrete components and conductor runs have been formed in two principal ways. Where high temperature processing has not been required, polymeric printed circuit boards have been used. Where high temperature processing was desired, asymmetric copper ceramic substrates using copper ceramic eutectic bonds have been used. In the conventional asymmetric copper-ceramic arrangement, the thickness of the copper has been held to a small fraction of the thickness of the ceramic so as to minimize the bowing of the structure at room temperatures due to differential stresses between the copper and the ceramic. Both structures have been thicker than optimum for a given strength and rigidity, and the designs have been of less than optimum thermal design for high density applications.

The thermal design issue has become more critical as the density requirement has increased. Current thermal criteria establish levels of heat generation in each substrate and dictate that each substrate be suitable for stacked assembly in close proximity to like substrates in an appropriate chassis or cabinetry. In these applications both the cabinetry and the substrates must be designed to remove the generated heat for control of the temperature rise in the equipment.

SUMMARY OF THE INVENTION

Accordingly, it is an object of the invention to provide an improved copper ceramic substrate for supporting plural electronic components.

It is still another object of the invention to provide a thin copper ceramic substrate of improved strength for supporting plural electronic components.

It is a further object of the invention to provide a thin, strong copper ceramic substrate for plural electronic components having an improved heat removal design.

It is a further object of the invention to provide an improved copper ceramic substrate for plural electronic components suitable for high temperature thick film processing.

It is an additional object of the invention to provide a thin and strong copper ceramic substrate for plural electronic components having two surfaces for component support.

It is still another object of the invention to provide a copper ceramic substrate for plural electronic components having improved manufacturerability.

These and other objects of the invention are achieved in a novel thin copper ceramic substrate of high strength and good thermal design suitable for high temperature thick film processing and useful in high density electronic applications.

The substrate is characterized by having a symmetrical ceramic-copper-ceramic laminated construction in which the two continuous outer ceramic layers (typically of 0.025" thickness) each provide a surface (of as much as 100 sq. inches) for mounting thick film interconnected electronic circuitry. The central copper core is of a three layer construction (typically 0.016" thick) in which two thin copper foils are provided, each bonded by a copper oxygen eutectic to the outer ceramic. The copper foils are selected to be sufficiently thin (0.001–0.005") and ductile at eutectic temperatures for wetting force of the eutectic to draw the foils into intimate contact with the ceramic to form a continuous bond. The central copper core is completed by a third copper layer, also bonded by a liquid copper-oxygen eutectic between the two foils. In the final substrate, the thickness of the copper core is held to between one-tenth and one-third the thickness of the substrate. When the assembly has cooled, residual tensile stresses remain in the inner copper layers and residual compressive stresses remain in the outer ceramic layer at normal working temperatures to provide a thin mechanically strong substrate.

The additional copper to copper bonds, since both surfaces may carry the oxide which forms the eutectic, facilitate the provision of adequate eutectic between the layers to fill any voids and to insure continuity in the bonds and the integrity of the copper core.

The overall arrangement has been found to permit an effective 30% reduction in substrate thickness over competitive arrangements while withstanding the stresses of recycling at the high temperatures (400°-900° C.) required for processing of thick film interconnections for bonding ceramic chip carriers.

The present ceramic-copper-ceramic arrangement, in contrast to practical copper-ceramic-copper arrangements can be symmetric, since the outer insulative layers can be continuous and coextensive for equalizing the bonding stresses without sacrifice of the circuit function. The present substrate is unusually compact and efficient in the utilization of the thickness dimension, since in an assembly of substrates, it may be used to support chip carriers upon both surfaces.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, described below:

FIG. 2 is a perspective view of a direct bond copper frame assembly of which the novel substrate, supporting encapsulated electronic components, is a part, the frame assembly being supported in a chassis designed for electronic application and providing indirect liquid cooling of the substrate;

FIG. 3 is a perspective view of a direct bond layer frame assembly supported in a chassis for aircooled operation.

DESCRIPTION OF THE PREFERRED EMBODIMENTS

Figure 1:
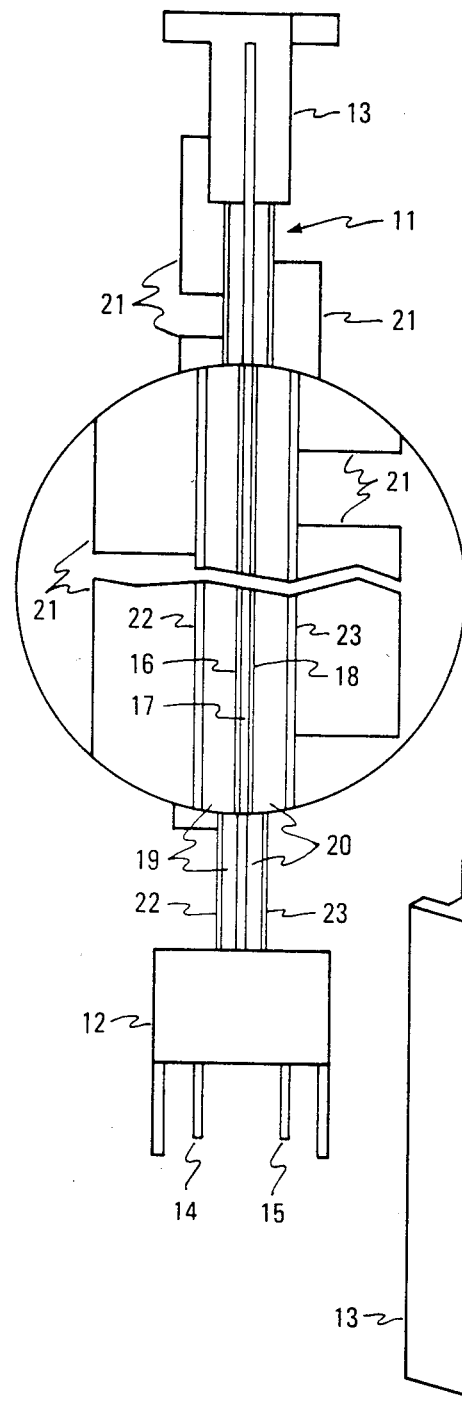
FIG. 1 is a cross-sectional view (including an expanded view) of a novel, direct bond copper ceramic substrate of elongated configuration for mounting encapsulated electronic circuitry upon both faces. In this first embodiment of the invention, strength, good thermal management, and thinness of the substrate are of primary concern.
Figure 2A:
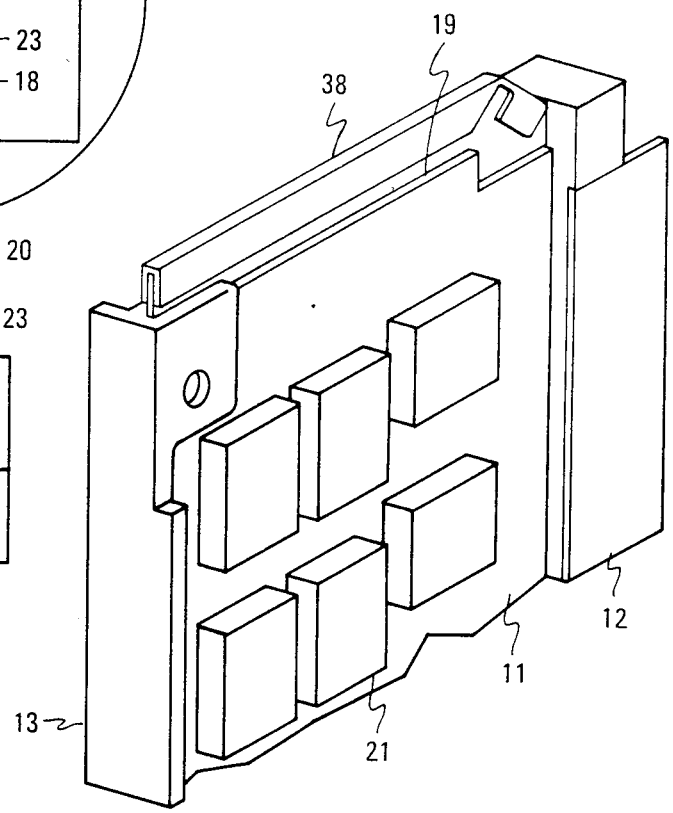
FIG. 2A is an auxiliary perspective view of the heat conductive design at the top of the frame assembly where it makes thermal contact with the chassis.

In accordance with a first embodiment of the invention, a direct bond copper ceramic substrate for supporting electronic circuitry in a chassis is shown in FIGS. 1, 2, 2A and 3. FIG. 2 is a perspective view of the substrate 11, itself a part of a frame assembly (11, 12, 13). The frame assembly (11, 12, 13) is designed for high density assembly in stacks, in an electronic equipment chassis, with either direct air cooling or indirect liquid cooling being provided to remove the heat generated in the electronic circuitry.

The frame assembly includes the substrate 11, which is of a thin elongated configuration (e.g. 0.066"×5½" to 1½"), a connector 12, which is attached along the long vertical edge of the substrate remote from the observer in FIG. 2, and the extractor bar 13 near to the observer in FIG. 2. As seen in FIG. 1, which is a cross-section of the frame assembly (11, 12, 13) taken in a plane orthogonal to the long axis, the substrate 11 extends between the extractor bar 13, which is illustrated at the top of FIG. 1, and the connector 12, which is illustrated at the bottom of FIG. 1.

The substrate 11, as best seen in FIG. 1, has the requisite strength, compactness, and thermal design to support electronic circuitry on both major faces in a direct air cooled or indirect liquid cooled environment within the chassis. The substrate 11, for which further details will be provided below, consists of a three layer (16, 17, 18) inner copper member, arranged between two outer layers 19 and 20 of alumina, upon which the electronic circuitry may be formed. The electronic circuitry includes encapsulated chip carriers 21, discrete electronic components, and conductors generally interconnected and supported upon two high temperature processed, thick film layers 22 and 23.

The extractor bar 13, which is attached along the vertical edge of the substrate near to the observer in FIG. 2, is normally used to extract the assembly from the chassis and labeled to identify the electronic circuitry, and to indicate its proper position within the electronic equipment chassis. Typically, the frame assemblies are stacked at intervals of approximately ⅜", the extractor bars of adjacent frame assemblies being designed to fit loosely enough to permit separate insertion, but closely enough to limit air leakage between the extractor bars and to duct cooling air along the surface of the substrate in a direct air cooling mode.

The connector 12 contains two parallel rows 14, 15 of contacts, each row making connection to circuitry on the nearer surface of the substrate, with the total number of connections being on the order of 100 for a 5" connector. The connector has a thickness (measured pependicularly to the substrate) approximately the same as that of the extractor bar 11 consistent with stacking the frame assemblies at approximately ⅜" intervals within the chassis.

The design of the electronic equipment chassis and the adaptation of the connectors 12 and extractor bars 13 of the frame assemblies for air cooled operation are best illustrated in FIG. 3. In the air cooled arrangement of FIG. 3, the chassis includes a skeletal structure formed of a network of horizontally spaced members 25 and 26, a pair of which defines the vertical walls of a chamber for accepting a plurality of frame assemblies in a stack. The members 25 and 26 are provided with slots 27 for supporting the short ends of the frame assemblies. The slots 27 are arranged to position the electronic assemblies in the electronic equipment chassis so that the connectors 12 may accurately engage a succession of socket members (not illustrated) which are arranged along the bottom surface of the chamber. The wall members 25 and 26 are of an open construction containing large windows whose vertical positions correspond approximately to the vertical positions of the inner surfaces of the connectors 12 and the extractor bars 13 to provide continuity in the air ducting surfaces. Thus, when air is forced into the large apertures of the member 25, it will efficiently enter the spaces between the adjacent surfaces of the frame assemblies, dividing into a plurality of paralleled smaller air ducts and then recombining at the large apertures of the member 26 before exiting the chassis. More particularly, each adjacent pair of frame assemblies defines one of these smaller ducts, of which the extractor bars 13 define the top, the connectors 12 define the bottom and the adjacent surfaces of two adjacent frame assemblies define the sides. While the principal cooling of the electronic circuitry may result from the air circulation just described, additional heat may be removed by conduction from the substrate via the mechanical contacts between the substrate extremities, when the members 25 and 26 are thermally conductive.

In both the direct air cooled and indirect liquid cooled applications, slots (27 or 28) are provided in the chassis supporting structures for acceptance of the frame assemblies, and appropriately, the frame assemblies are designed for insertion into these slots. For these purposes, the extremities of the substrate 11 extend beyond the connectors 12 or extractor bars 13 (the upper extremity of the frame assembly being shown in FIG. 2A). As shown in FIGS. 2, 2A and 3, the connectors 12 (and extractor bars 13) are selected to fit between the inner surfaces of the members 25 and 26, and are too wide to enter the slots 27. The substrate 11, on the other hand, exceeds the distances between the inner surfaces of the members 25, 26, and the extremities are thin enough to enter the slots of the chassis.

An electronic equipment chassis designed for liquid cooled operation and a frame assembly arranged for operation in a liquid cooled chassis are illustrated in FIG. 2. In the FIG. 2 arrangement, the chassis includes a skeletal structure formed of a network of vertically oriented ducted metallic bars 29 and horizontally oriented ducted metallic bars 30, 31. These bars generally define the two lateral surfaces, and the upper and lower surfaces, respectively, of a chamber for accepting stacked frame assemblies. Normally, the chassis is provided with a succession of socket members (not illustrated) which define the back surface of the chamber, while the front surface of the chamber is provided with a cover, which may be removed for inspection or insertion of the frame assemblies.

The ducted metallic bars (29, 30, 31) of the chassis are preferably of a good heat conducting material such as aluminum, and a cooling fluid is pumped through the internal ducts 32–37 to carry away any heat transferred from the frame assemblies to the bars (29, 30, 31).

The heat transfer from the substrates 11 to the ducted bars 30, 31 in a liquid cooled arrangement, is achieved at the point of insertion of the extremities of the substrates 11 into the slots 28. In order to insure good thermal contact with the bars 30, 31, a resilient wire member (not illustrated) is provided designed to fit within the slot between one face of the substrate and one wall of the slot and force the remote wall of the substrate into intimate physical contact with the other wall of the slot.

The substrate is also designed to optimize the thermal contact between the frame assembly and the chassis. This is best illustrated in FIG. 2A. While FIG. 2A does not illustrate all of the individual layers of the substrate, the alumina layer 19 is illustrated terminating at about the point (measured along the major axis of the substrate) where the extractor bar terminates. The copper core (16, 17, 18), which extends past the alumina layers, is sheathed by a protective U-shaped member 38, which is soldered to the exposed copper core at the upper extremity of the substrate. The U-shaped member 39, which is typically nickel, is designed to provide both a mechanically durable and an efficient thermally conductive path from the core of the substrate to the slots (28) in the bars 30, 31.

The detailed construction of the substrate 11, forming a part of the frame assemblies illustrated in FIGS. 1, 2, 2A and 3 and suited to both air cooled and liquid cooled operation, will now be described in greater detail with principal reference to FIG. 1. FIG. 1 is drawn to a scale which exaggerates the thickness of the substrate, so as to show the individual layers 16, 17, 18 making up the inner copper member and the outer layers 19 and 20 of alumina. These are the structural components of the substrate and they provide a very thin, very strong and thermally efficient support for electronic circuitry.

The substrate 11, having been processed at a temperature in the vicinity of the copper oxygen eutectic (1065° C.), as will be described subsequently, is not adversely affected by the lower temperatures required for application of the electronic circuitry so long as they do not exceed the melting point of the copper-oxygen eutectic or of copper. The thick film process, which is suitable, and which results in a multilayered region (22 or 23) is carried out at temperatures in the vicinity of 400°–900° C., and incorporates the use of conventional base metal copper thick film paste materials. The thick film copper conductor pastes include a glass frit, copper powder, and an organic binder. The thick film paste is first applied to the alumina by a silk screen process in the desired conductive pattern. After application of the paste, the substrate is fired to the temperature required to drive off the solvent and organic binder, fuse the glass frit to the ceramic, and form continuous conducting copper runs which are chemically and mechanically bonded to the alumina. The accepted bonding process of thick film copper pastes to alumina substrates consists of a copper oxide chemical bond augmented by a glass frit melt resulting in a mechanical bond. This process, which may involve a build up of 2–5 layers including thick film dielectric insulation layers, typically requires temperatures high enough to react the copper component of the paste with the alumina and melt the glass frit into the alumina grain structure. The result is a conventional base metal multilayer conductor and dielectric substrate exhibiting acceptable adhesion. The multiple layers of conductors separated by dielectrics are connected by copper paste filled via holes in the dielectric layers and give the circuit a 3 dimensional capability. After the top conductor layer has been fired, the chip carriers and discrete components are attached to the thick film interconnect system. The chip carriers and discrete electrical components are attached in a manner which provides an intimate mechanical contact between the base of the chip carrier or component and the substrate for good heat transfer. Either at the same time or in a subsequent step, electrical connections are provided between the chip carriers and the discrete electrical components to the conductive runs. This is normally provided by a soldering step.

Throughout the processing of the thick film layers 22, 23 and the application of the chip carriers and components 21 to the thick film layer, the substrate 11, when dimensioned and fabricated as taught herein, will remain substantially flat and undistorted by the stresses created in the processing and attachment steps.

The substrate 11, which consists of three inner copper layers 16, 17, 18, and the two alumina layers 19 and 20 all bonded together provides a substrate which is not adversely affected by the elevated temperatures of thick film processing, as explained above, and which, while being thin, is also very strong at working temperatures as will be explained below.

The strength of the substrate is based in part upon the virtual three-layer design in which differential stresses exist between the central copper core and the outer layers of alumina at working temperatures and in part upon the integrity of the four bonds formed between each of the five actual layers of the substrate. In the substrate of the first embodiment, the central copper core, which is placed between the outer alumina layers, is formed of three separate layers (16, 17, 18). The copper layers are formed of OFHC (Oxygen Free, High Conductivity) copper in commercially available thicknesses (e.g. 0.003", 0.010" and 0.003"). The alumina layers are formed of 96% alumina in a commercially available thickness (e.g. 0.025"). The alumina layers are of equal thickness and of matching continuous surface extensions for equalization of any bending stresses. The finished substrate has a thickness of 0.066" of which 0.016" represents the thickness of the copper core. The exemplary substrate, while having a surface dimension of $5\frac{1}{2}" \times 1\frac{1}{2}"$, uses a design readily adapted to substrates having much larger surface areas.

The strong "virtual three-layer" design entails a central copper core which is under tensile stresses and a pair of outer layers of alumina which are under matching compressive stresses at temperatures significantly below the temperatures at which these layers are bonded. In formation of a bond between copper and alumina, for instance, adhesion occurs at the copper oxygen eutectic temperature of about 1065° C. At this temperature, the copper is soft and ductile but not yet liquid and the copper oxide present will be a liquid at approximately the eutectic temperature. The process temperature must be carefully controlled to ensure liquefaction of the eutectic without melting the copper foil, which will occur should the temperature increase 20° C. The process is carried out in a temperature controlled oven in an inert atmosphere and using copper foils having pre-oxidized surfaces. The copper oxygen eutectic forms in a controlled amount on the surface of the copper. When liquid, the eutectic wets the alumina and enters into the grain structure of the alumina producing good adhesion. At the same time, the copper surface is also wet by the eutectic and good adhesion occurs. The alumina-copper bond forms quickly (typically in a few minutes). After the bond has been formed, it must usually experience a higher temperature than the minimum eutectic temperature for it to soften, implying that the eutectic mixture has undergone a change in forming the bond, permitting subsequent processing at eutectic temperatures to form other bonds.

The process produces a strong substrate. After the bond has been formed at the copper oxygen eutectic temperature and the substrate has cooled to working temperatures, copper which has a larger coefficient of thermal expansion (or contraction) than the alumina is subjected to substantial stretching (or tensile) stresses, while corresponding compressive stresses are created in the two outer layers of alumina. This distribution of stresses is quite appropriate to the materials involved, the metallic copper during cooling withstanding substantial tensile stresses without harm. The tensile stresses on the copper during cooling may produce some yielding of the copper but under the constraints herein taught, the copper layer retains its integrity at working temperatures and contributes to the strength of the substrate. Assuming that copper yielded during cooling, reheating of the substrate may cause compressive stresses in the copper and tensile stresses in the alumina sufficient to cause cracking of the alumina. The three layer design so far described, in which the thickness of the copper core is held between one-tenth and one-third of the thickness of the substrate (e.g. 24%) prevents tensile stresses in the alumina that would fracture the alumina when the substrate is reheated to the high temperatures (400°–900° C.) required for thick film processing. The design is stress balanced when the outer alumina layers are of like thicknesses and coextensive, thus avoiding any tendency of the structure to warp at temperatures lower than the eutectic bonding temperature.

The strength of the substrate increases as the temperature falls below eutectic temperatures, since the stresses in the layers increase proportionately, diminished by any yielding of the copper occurring during cooling. At working temperatures, any forces acting to deform the substrate must exceed the residual compressive stresses on the alumina before deformations will occur and breakage result. Any residual tensile stress in the copper makes the substrate more able to withstand stresses at working temperatures. When reheating occurs at the thick film processing temperatures (400°–900° C.), the copper thickness must be limited so that tension exerted by the copper does not exceed the tensile strength of the alumina and cause the alumina to rupture. The design withstands thick film processing temperatures, and the localized stresses produced during the process. At room temperature the substrates are less subject to breakage in routine handling.

While the design optimization has been arrived at empirically, the substrate has been susceptible of repeated cycles of reheating as necessary, for example for a five layer thick film process, and the durability of the finished substrates has been found to be increased for practical sized substrates.

The four copper oxygen eutectic bonds formed between the five layers of the substrate must be uniform, blister free and of maximum integrity if the structural (and thermal) advantages described earlier are to be achieved. The three layer (16, 17, 18) copper core design has been found to provide better bonds between the alumina and copper than would occur had a single layer copper core of comparable thickness been employed and the formation of a multilayered copper core has been found not to cause offsetting disadvantages over a single layer copper core of the same thickness.

The processing of the substrate may occur in either a single firing step in which all four bonds are achieved simultaneously or in a process in which the bonds between the alumina and the outer copper layers are formed first and the bonds internal to the three layer copper core formed last.

The integrity of the bond between the alumina and the outer copper layers (16, 18) is improved by use of a thin foil of from 0.001" to 0.005" for these layers. Assuming that multiple fired bond is employed, it is normally desirable that the foil be less than 10% the thickness of the alumina since upon cooling the assembly should remain flat and unbowed to facilitate further handling. This latter consideration dictates use of a thinner foil when the alumina is at the thinner limit of its range (0.010" and 0.040").

In both single firing and multiple firing processes, the use of a copper foil in the range of from 0.001" to 0.005" thicknesses has been found to contribute to the integrity of the copper-alumina bond. The improvement in the bond results from increased compliance of the copper layer when it is sufficiently thin—permitting a more intimate fit to the undersurface of the alumina. The process depends upon the ductility of the copper, which increases as the eutectic temperature is approached. When the eutectic temperature is exceeded, the eutectic is liquified, wetting the surfaces of the alumina and copper, and tending to draw the wetted surfaces into more intimate contact. The wetting forces are small and the thin alumina layer is unyielding. Therefore, the copper at near melting temperature, and therefore of near maximum ductility, and in a thin layer for maximum compliance, yields to these forces, and is drawn into intimate contact with the alumina. Experience has shown that without other measures, a thicker layer of copper, as for instance one of 0.015" thickness, will not consistently form a reliable bond with the alumina.

Satisfactory copper to copper bonds may be achieved with relatively thick center copper members (17). In the example under discussion, the member 17 is 0.010" in thickness, but good bonds have been achieved using substantially thicker copper members as, for instance, 0.030". The mechanism for formation of the copper to copper bond depends upon wetting, which either draws the surfaces into intimate contact or floods the adjoining copper surfaces. The ductility of the central copper member at near eutectic temperatures aids in reducing the effects of some surface irregularities, while the provision of adequate oxide, which may be coated on both adjoining surfaces, facilitates flooding the interface with liquefied eutectic, insuring continuity in the bond.

In formation of both the bond between the alumina and copper and between copper and copper, relatively large areas are involved, making it difficult to apply external pressures to bring the thin layers into intimate contact. Such measures are likely to interfere either with the heat distribution or to crack the thin layers of fragile ceramic. Under such conditions, the delicate wetting forces provide a preferred mechanism for ensuring an intimate bond with minimum breakage.

A substrate in accordance with the first embodiment may be fabricated by the following process. The copper foil (0.003") is of OFHC (Oxygen Free High Conductivity) type and the ceramic sheets (0.025) are 96% alumina ($Al_2O_3$) as earlier noted. Both the copper foil and the alumina are vapor degreased with a commercial degreasing solvent to remove olefins and other organic matter. The copper is then oxidized in Enthone Enplate 0825 solution to form a black coating of Cupric Oxide (CuO) on the surface. The copper is then placed on a fire brick carrier and the alumina sheet is placed on top of the copper. The carrier is then placed on the belt of the direct bond tunnel furnace and fired at 1070° C. in a nitrogen atmosphere for 5 to 10 minutes. The CuO is assumed to behave as an azeotropic mixture melting at a temperature of 1065° C., some 18° lower than the melting point of the unoxidized copper. As the oxidized layer on the copper melts at 1070° C., a eutectic liquidus skin is formed upon the copper which wets the ceramic substrate. Upon cooling, a copper-copper oxide complex bond is formed between the alumina and the copper. Upon emerging from the furnace, the bonding is complete and the copper surface has been reduced (by the nitrogen atmosphere of the furnace)to copper having an orange color.

In bonding the second copper foil to the second alumina layer the same steps are repeated.

The final assembly is achieved by initially oxidizing the exposed surfaces of the 0.003" copper foils and both surfaces of the central piece of copper (0.010"). The layers are then assembled upon an inert fire brick carrier, with a first alumina-copper foil subassembly on the bottom, the copper foil face up, the 0.010" copper member next, and a second alumina-copper foil subassembly, copper foil face down, on top. The assembly is fired as before in the furnace (in a nitrogen atmosphere) for 5 to 10 minutes to fuse the three copper layers into a single member. Upon emerging from the furnace the copper core is unified with no significant voids or unbonded areas, as would affect the thermal or electrical properties of the final layer.

As earlier noted, all the layers could have been bonded in one firing step with some loss in yield. While oxygen free high conductivity copper was used in the process just described, ETP (Electrolytic Tough Pitch) may also be used, with an adjustment in the temperature profile of the process.

Figure 4:
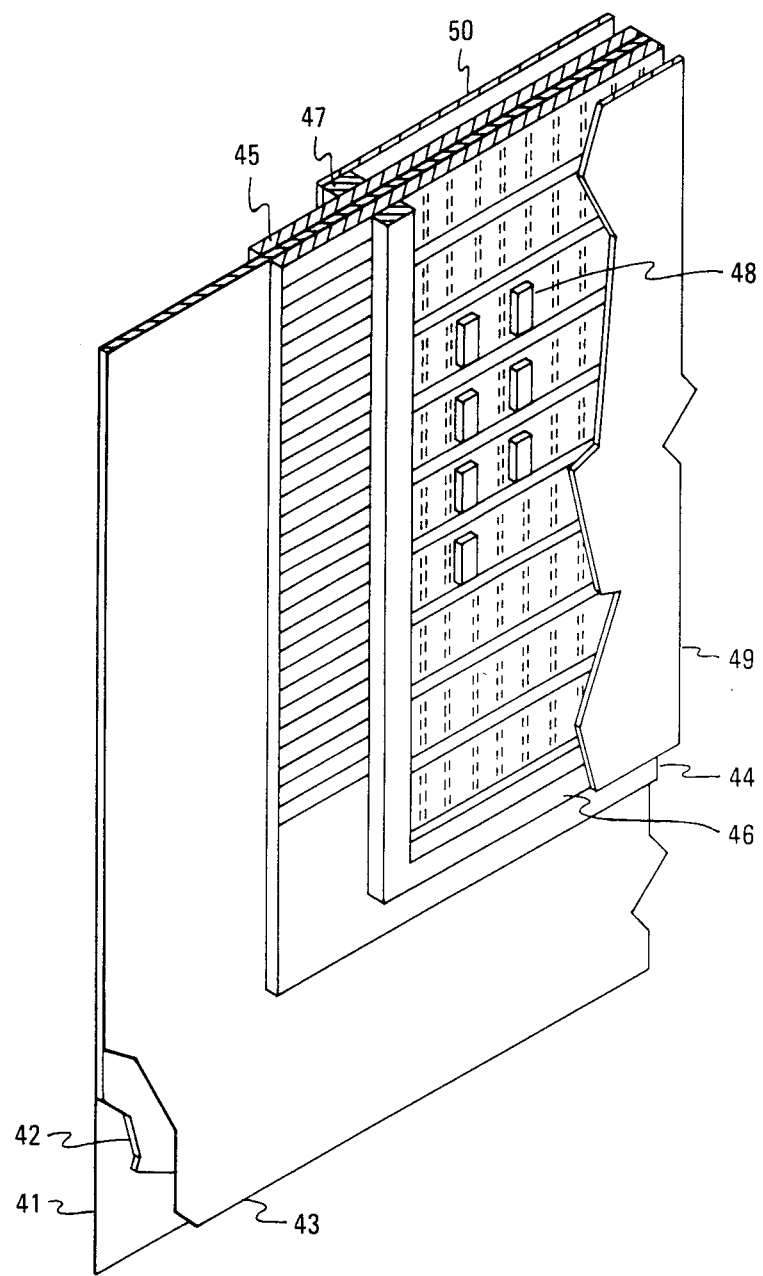
FIG. 4 is a perspective view of a second substrate, as a second inventive embodiment, in a larger design suitable for either air or liquid cooling. The second embodiment is designed for unencapsulated electronic components.

A substrate in accordance with a second embodiment of the invention is shown in FIG. 4, designed for use with unencapsulated integrated circuit chips. The substrate consists of a central copper conductor formed of three layers 41, 42, 43, as previously noted, inserted between a first alumina layer 44 on the near face of the substrate and an alumina layer 45 on the remote face of the substrate. A rectangular alumina frame 46 is bonded to the near face of the substrate and a corresponding rectangular alumina frame 47 is bonded to the remote surface of the substrate. The rectangular frame is from 0.050" to 0.100" in height and from 0.080" to 0.100" in width and has a surface area measured in square inches.

The frames 46 and 47 are designed to provide a hermetic environment for unencapsulated chips, the bonding to the substrate permitting electrical connections passing beneath the hermetic seals. A suitable bond for the members 46 and 47 is a glass seal using low melting point glass. Assuming that the thick film conductive runs have been provided within the region to be enclosed by the rectangular frame, integrated chips 48 may be attached to the surface of the substrate and suitable connections may be made between the ICs and the conductive runs. After the thick film processing is over, but before attachment of the integrated circuit chips, the frames 46, 47 may be applied. The enclosure may then be sealed hermetically by the application of invar covers 49, 50 of from 0.010 to 0.015" thickness to the alumina frames using solder.

The copper ceramic substrates so far described provide a substrate imminently suited to 900° C. thick film processing on both sides to interconnect electrical and microelectronic devices packaged in leadless chip carriers. These substrates are particularly suitable for use in high shock and vibration environments, and where heat generated sets limits on circuit density. The improved physical properties of the substrate are achieved as a result of the material combination, the geometry of the materials and the bonding of the materials. Improved electrical properties are achieved by the selection of appropriate ceramic thickness and thick film process variables.

The bonding of the ceramic at a high temperature (1065° C.) achieves a compressive stress state in the ceramic as described earlier, greatly reducing ceramic cracking susceptibility at temperatures below 200° C. where normal usage occurs. Bonding ceramic to both sides of the copper core provides stress symmetry and aids in achieving a flatness suitable for thick film processing. The presence of ceramic on both outside surfaces and its metallurgical bond achieves a high bending modulus. The copper below the ceramic provides high thermal and electrical conductivity for heat removal and electrical ground respectively. The thickness of the ceramic can be selected to achieve a wider range of thick film conductor characteristic impedance than is achievable with printed ground references in polymeric printed boards. The preferred, and most practical, material for the ceramic is alumina.

While the specific copper ceramic substrate disclosed has a relatively small area (e.g. 1½×5½), the substrate is useful in larger areas, provided that the thicknesses of the layers are suitably increased for rigidity. Dimensions of 12"×12" (~100 sq. inches) appear to be practical, although most current applications are for smaller dimensions.

The substrate herein described is thinner than competitive substrates and is more structurally suitable for ceramic VLSI packages than competitive polymeric printed circuit boards. The present substrate achieves a minimum package thickness consistent with reasonable durability. The improvement in strength achieved by the prestressed ceramic-copper-ceramic construction makes possible substrates as thin as 0.025", that are rugged enough for thick film processing. The substrate thickness of 0.066" for the first embodiment is 30% thinner than comparable non-symmetric ceramic substrates or polymeric printed circuit boards. The coefficient of thermal expansion (CTE) of the copper ceramic substrate matches that of the ceramic VLSI packages, and avoids the problem of a mismatch exhibited by the polymeric printed circuit substrates.

The thermal properties of a large area copper ceramic substrate herein disclosed provides a simpler solution for the heat dissipation problem than conventional polymeric printed circuit boards. The ceramic has a higher thermal conductivity than the polymer used in making printed circuit boards and when the ceramic is mounted upon a substrate whose core is solid copper, even higher thermal conductivity is provided. This construction provides higher power dissipation for a given substrate area in a given cooling environment than polymeric PCB designs. In the case where certain of a collection of integrated circuit carriers mounted on a substrate have excessive heat dissipation, the design allows the heat to be distributed from the "hottest" individual carrier though the thickness of the ceramic and into the copper core of the substrate, distributing the heat over a larger area and reducing the temperature rise in the carrier. Because of the high thermal conductivity through the ceramic, the circuitry is readily cooled by air flowing over the surface of the circuitry. Because of the high thermal conductivity of the copper core the circuitry is also readily cooled by conduction through the copper core to a liquid cooled heat sink.

What is claimed is:

1. A thin direct bond copper ceramic substrate of high strength and good thermal conductivity for electronic applications, comprising:

A. a first layer of ceramic, having a first surface for mounting electronic circuitry, B. a second layer of copper foil having a first surface, permanently bonded by a liquid copper oxygen eutectic adhesive to a second surface of said first layer, the copper foil being sufficiently thin, and the ductility of the copper sufficiently high at eutectic temperature for wetting forces to draw the foil into intimate contact with the first layer to form a continuous bond, C. a third layer of ceramic, having a first surface for mounting electronic circuitry, said first and third layers having equal thicknesses, and symmetrically matched continuous extensions for equalization of bending stresses, D. a fourth layer of copper foil having a first surface, permanently bonded by a liquid copper oxygen eutectic adhesive to a second surface of said third layer, the copper foil being sufficiently thin, and the ductility of the copper sufficiently high at eutectic temperatures for the wetting forces to draw the foil into intimate contact with the third layer to form a continuous bond, and E. a fifth layer of copper having a first surface permanently bonded by a liquid copper oxygen eutectic adhesive to a second surface of said second layer and a second surface bonded by a liquid copper oxygen eutectic to a second surface of said fourth layer, cooling after bonding causing tensile stresses in said inner copper layers and compressive stresses in said outer ceramic layers at working temperatures to form a thin mechanically strong substrate of high thermal conductivity suitable for supporting heat dissipating electronic circuitry.

2. A substrate as set forth in claim 1 wherein
the thicknesses of said second and fourth layers of copper foil are equal to equalize the tensile stresses therein to insure flatness of the substrate.

3. A substrate as set forth in claim 2 wherein
the first and third layers are of an alumina ceramic, and wherein
the second and fourth layers of copper foil are less than 1/10th the thickness of said first and second layers to reduce bowing in subassemblies of the first and second; and third and fourth layers.

4. A substrate as set forth in claim 2 wherein
the first and third layers are of an alumina ceramic, and wherein
the combined thickness of said three copper layers is between one-tenth and one-third the thickness of the substrate.

5. A substrate as set forth in claim 4 wherein
said second and fourth layers are of a thickness of from 0.001" to 0.005".

6. A substrate as set forth in claim 5 wherein
said three copper layers are of a total thickness of from 0.005" to 0.030".

7. A substrate as set forth in claim 6 wherein
said first and third layers are of a thickness of from 0.010" to 0.040".

8. A substrate as set forth in claim 2 wherein
said least one of said copper layers extends beyond said first and third ceramic layers for conductive connection to a heat sink, the thermal conductivity of said copper layers providing a path for conducting heat away from electronic circuitry supported on said substrate.

9. A thin direct bond copper ceramic substrate of high strength and good thermal conductivity for electronic applications, comprising:

A. a first layer of ceramic, having a first surface for mounting electronic circuitry, B. a second layer of copper foil having a first surface, permanently bonded by a liquid copper oxygen eutectic adhesive to a second surface of said first layer, the copper foil having a thickness of from 0.001 to 0.005", for compliance with the wetting forces, acting to draw the foil into intimate contact with the first layer to form a continuous bond, C. a third layer of ceramic, having a first surface for mounting electronic circuitry, said first and third layers having equal thicknesses, and symmetrically matched continuous extensions for equalization of bonding stresses, D. a fourth layer of copper foil having a first surface permanently bonded by a liquid copper oxygen eutectic adhesive to a second surface of said third layer, the copper foil having a thickness of from 0.001 to 0.005" for compliance with the wetting forces acting to draw the foil into intimate contact with the third layer to form a continuous bond, and E. a fifth layer of copper having a first surface permanently bonded by a liquid copper oxygen eutectic adhesive to a second surface of said second layer and a second surface bonded by a liquid copper oxygen eutectic to a second surface of said fourth layer, the cooling of said five bonded layers causing tensile stresses in said inner copper layers and compresssive stresses in said outer ceramic layers to form a thin mechanically strong substrate of high thermal conductivity suitable for supporting heat dissipating electronic circuitry.

10. A substrate set forth in claim 9 wherein said first and third layers are of alumina ceramic, suited for thick film processing at temperatures not exceeding that of the copper oxygen eutectic.

* * * * *